(12) United States Patent
Kondo

(10) Patent No.: US 12,408,484 B2
(45) Date of Patent: Sep. 2, 2025

(54) LIGHT EMITTING ELEMENT AND METHOD OF MANUFACTURING LIGHT EMITTING ELEMENT

(71) Applicant: NICHIA CORPORATION, Anan (JP)

(72) Inventor: Hiroki Kondo, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/525,242

(22) Filed: Nov. 30, 2023

(65) Prior Publication Data

US 2024/0113253 A1    Apr. 4, 2024

Related U.S. Application Data

(62) Division of application No. 17/330,052, filed on May 25, 2021, now Pat. No. 11,888,089.

(30) Foreign Application Priority Data

May 27, 2020    (JP) .................. 2020-091976
Dec. 2, 2020    (JP) .................. 2020-200405

(51) Int. Cl.
   *H01L 33/00*    (2010.01)
   *H10H 20/01*    (2025.01)
   (Continued)

(52) U.S. Cl.
   CPC .... *H10H 20/812* (2025.01); *H10H 20/01335* (2025.01); *H10H 20/018* (2025.01);
   (Continued)

(58) Field of Classification Search
   None
   See application file for complete search history.

(56) References Cited

U.S. PATENT DOCUMENTS

2002/0179923 A1    12/2002    Morita et al.
2008/0149917 A1     6/2008    Park
(Continued)

FOREIGN PATENT DOCUMENTS

JP    09-153645 A    6/1997
JP    2001-237457 A    8/2001
(Continued)

OTHER PUBLICATIONS

Non-Final Office Action in U.S. Appl. No. 17/330,052 dated Jun. 22, 2023.

*Primary Examiner* — Bradley Smith
(74) *Attorney, Agent, or Firm* — Foley & Lardner LLP

(57) ABSTRACT

A method of manufacturing a light emitting element includes: an n-side nitride semiconductor layer growing process in which an n-side nitride semiconductor layer is grown; an active layer growing process in which an active layer comprising a plurality of nitride semiconductor well layers and a plurality of nitride semiconductor barrier layers is grown on the n-side nitride semiconductor layer, wherein the active layer is configured to emit ultraviolet light; and a p-side nitride semiconductor layer growing process in which a p-side nitride semiconductor layer is grown on the active layer. The active layer growing process includes: a first barrier layer growing process, a second barrier layer growing process, and a well layer growing process.

17 Claims, 6 Drawing Sheets

(51) Int. Cl.
*H10H 20/811* (2025.01)
*H10H 20/812* (2025.01)
*H10H 20/824* (2025.01)
*H10H 20/825* (2025.01)

(52) U.S. Cl.
CPC ........ *H10H 20/811* (2025.01); *H10H 20/824* (2025.01); *H10H 20/825* (2025.01)

(56) References Cited

U.S. PATENT DOCUMENTS

| | | |
|---|---|---|
| 2008/0217632 A1 | 9/2008 | Tomiya et al. |
| 2010/0133506 A1 | 6/2010 | Nakanishi et al. |
| 2011/0227033 A1 | 9/2011 | Kushibe et al. |
| 2013/0069032 A1 | 3/2013 | Kushibe et al. |
| 2013/0328010 A1 | 12/2013 | Yu et al. |
| 2014/0045289 A1* | 2/2014 | Nago .................. C23C 16/301 438/47 |
| 2014/0048771 A1 | 2/2014 | Takahashi et al. |
| 2016/0211423 A1* | 7/2016 | Schubert ............ H10H 20/8512 |
| 2018/0254377 A1* | 9/2018 | Kuhr ........................ H01L 33/02 |
| 2018/0309024 A1 | 10/2018 | Miyoshi |
| 2018/0337271 A1* | 11/2018 | Kotani ................ H01L 29/7787 |
| 2019/0355868 A1* | 11/2019 | Fimland ............. H01S 5/04253 |

FOREIGN PATENT DOCUMENTS

| | | |
|---|---|---|
| JP | 2002-141617 A | 5/2002 |
| JP | 2002-335052 A | 11/2002 |
| JP | 2008-288532 A | 11/2008 |
| JP | 2011-035125 A | 2/2011 |
| JP | 2011-198859 A | 10/2011 |
| JP | 2013-065630 A | 4/2013 |
| JP | 2017-084851 A | 5/2017 |
| WO | WO-2005/020396 A1 | 3/2005 |
| WO | WO-2008/153130 A1 | 12/2008 |

* cited by examiner

LIGHT EMITTING ELEMENT AND METHOD OF MANUFACTURING LIGHT EMITTING ELEMENT

CROSS-REFERENCE TO RELATED APPLICATIONS

This application is a divisional of U.S. patent application Ser. No. 17/330,052, filed on May 25, 2021, which claims priority to Japanese Patent Application No. 2020-091976, filed on May 27, 2020, and Japanese Patent Application No. 2020-200405 filed on Dec. 2, 2020. The disclosures of these applications are hereby incorporated by reference in their entireties.

BACKGROUND

The present disclosure relates to a light emitting element and a method of manufacturing a light emitting element.

In recent years, the development of ultraviolet light emitting elements has been actively pursued. For example, Japanese Patent Publication No. H09-153645 discloses a light emitting element having a multiple quantum well structure suited for emitting ultraviolet light.

SUMMARY

Efforts to increase the output of such an ultraviolet light emitting element having a multiple quantum well structure are underway, but there is still room for improvement.

Certain embodiments of the present disclosure are directed to a high output ultraviolet light emitting element having a multiple quantum well structure and a method of manufacturing the same.

According to one embodiment, a light emitting element includes: an n-side nitride semiconductor layer, an active layer emitted ultraviolet light disposed on the n-side nitride semiconductor layer and composed of a plurality of nitride semiconductor well layers and a plurality of nitride semiconductor barrier layers, and a p-side nitride semiconductor layer disposed on the active layer. At least one of the plurality of barrier layers includes, successively from the n-side nitride semiconductor layer side, a first barrier layer containing Al and Ga, and a second barrier layer disposed in contact with the first barrier layer, containing Al, Ga, and In, and having a smaller band gap energy than the first barrier layer. At least one of the plurality of well layers is disposed in contact with the second barrier layer and has a smaller band gap energy than the second barrier layer.

According to another embodiment, a method of manufacturing a light emitting element includes: an n-side nitride semiconductor layer growing process in which an n-side nitride semiconductor layer is grown, an active layer growing process in which an active layer emitted ultraviolet light, which includes a plurality of nitride semiconductor well layers and a plurality of nitride semiconductor barrier layers, is grown on the n-side nitride semiconductor layer, and a p-side nitride semiconductor layer growing process in which a A-side nitride semiconductor layer is grown on the active layer, wherein the active layer growing process includes a first barrier layer growing process in which a first barrier layer is grown by using a source gas containing an Al source gas, a Ga source gas, and an N source gas, a second barrier layer growing process in which a second barrier layer is grown on the first barrier layer by using a source gas containing an Al source gas, a Ga source gas, an In source gas, and an N source gas, and a well layer growing process in which a well layer having a smaller band gap energy than the second barrier layer is grown on the second barrier layer by using a source gas containing a Ga source gas and an N source gas.

A light emitting element and a method of manufacturing a light emitting element according to one embodiment of the present disclosure can provide a high output ultraviolet light emitting element and a method of manufacturing the same.

DETAILED DESCRIPTION

Figure 1:
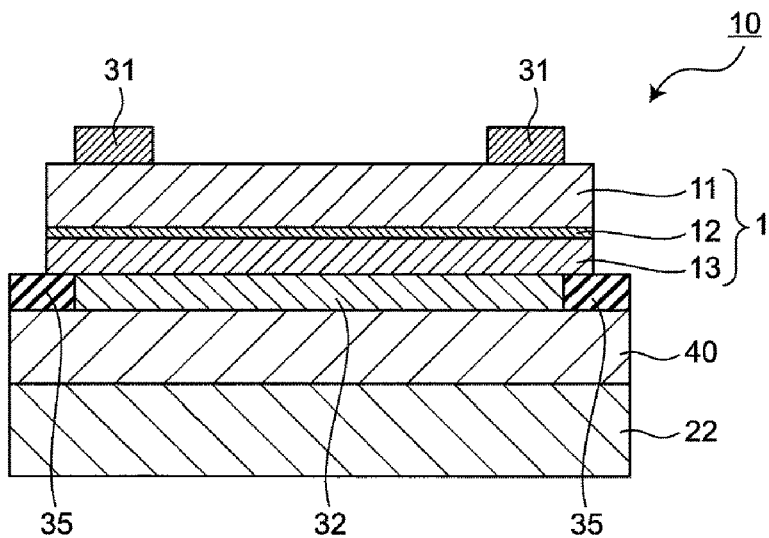
FIG. 1 is a cross-sectional view of the structure of a light emitting element according to one embodiment of the present disclosure.

Certain embodiments and examples for implementing the present disclosure will be explained below with reference to the accompanying drawings. The light emitting elements and the methods of manufacturing the light emitting elements described below are examples for giving shape to the technical ideas of the present disclosure, but the claimed invention is not limited by those examples unless specifically stated.

In the drawings, elements having the same function might be denoted with the same reference numerals. In view of explaining the main points and ease of understanding, and for the sake of convenience, the constituent elements might be described separately in some embodiments or examples, but the constituent elements can be replaced in part or combined. The description of a common feature already discussed with reference to a preceding embodiment or example might be omitted, and only the differences will be explained in the embodiments or examples that follow. For example, description of a similar effect achieved by a similar constituent element will not be repeated in each successive embodiment or example. The sizes or relative positions of elements shown in each drawing might be exaggerated for clarity of explanation.

A semiconductor layered body used in a light emitting element such as a light emitting diode employing nitride semiconductors has an n-side nitride semiconductor layer, a p-side nitride semiconductor layer, and an active layer disposed between the n-side nitride semiconductor layer and the p-side semiconductor layer. For the active layer, for example, a multiple quantum well structure that includes a plurality of well layers and a plurality of barrier layers is used, and in a blue light emitting element, for example, InGaN well layers are used. Even in an ultraviolet light emitting element, in the case of a relatively long emission wavelength, the active layer can be formed with InGaN well layers having a small In content. In the case of a light emitting element emitted ultraviolet light, AlGaN barrier layers can be used.

In the course of their extensive studies, the present inventors found that an active layer alternately including InGaN well layers and AlGaN barrier layers had the tendency of easily causing lattice relaxation attributable to a large lattice constant difference between a well layer and a barrier layer, as well as having large surface roughness values. The present inventors suspected that the recombination probability was reduced in the active layer because of these factors. Accordingly, the present inventors tested the use of AlInGaN as the barrier layers in order to reduce the lattice constant difference between a well layer and a barrier layer as well as reducing the surface roughness of the barrier layers. However, the recombination probability in the active layer composed of InGaN well layers and AlInGaN barrier layers barely changed even though the lattice constant difference between a well layer and a barrier layer was reduced, and the reduced surface roughness of the barrier layers allowed the well layers to grow with good crystallinity.

The present inventors estimated the cause of the barely changed electron-hole recombination probability in the active layer to be the In contained in the barrier layers that reduced the band gap energy difference between the well layers and the barrier layers. In other words, it was estimated that even though the lattice constant difference between a well layer and a barrier layer was reduced, the effect of electron confinement in the well layers was reduced to hinder electron-hole recombination in the active layers. Accordingly, the present inventors disposed, in addition to barrier layers (second barrier layers) containing Al, Ga, and In, barrier layers (first barrier layers) containing Al and Ga and having a larger band gap energy than the second barrier layers on the second barrier layers on the n-side nitride semiconductor layer side. As a result, the present inventors were able to increase the recombination probability thereby producing a high output light emitting element as compared to a light emitting element without any first barrier layer.

A light emitting element according to one embodiment of the present disclosure, which was created based on the findings described above, has an n-side nitride semiconductor layer, an active layer emitted ultraviolet light disposed on the n-side nitride semiconductor layer and including a plurality of nitride semiconductor well layers and a plurality of nitride semiconductor barrier layers, and a p-side nitride semiconductor layer. At least one of the plurality of barrier layers has, successively from the n-side nitride semiconductor layer side, a first barrier layer containing Al and Ga, and a second barrier layer disposed in contact with the first barrier layer, containing Al, Ga, and In, and having a smaller band gap energy than the first barrier layer. At least one of the plurality of well layers is disposed in contact with the second barrier layer and has a smaller band gap energy than the second barrier layer.

A light emitting element and a method of manufacturing the light emitting element according to one embodiment will be explained below with reference to the accompanying drawings.

1. Light Emitting Element

FIG. 1 is a cross-sectional view of a light emitting element 10 according to one embodiment.

The light emitting element 10 according to this embodiment includes, as shown in FIG. 1, a second substrate 22, a metal layer 40 disposed on the second substrate 22, a second electrode 32 and an insulation layer 35 disposed on the metal layer 40, a semiconductor layered body 1 disposed on the second electrode 32 and the insulation layer 35, and first electrodes 31 disposed on the semiconductor layered body 1.

The semiconductor layered body 1 includes, successively from the second electrode 32 side, a p-side nitride semiconductor layer 13 electrically connected to the second electrode 32, an active layer 12, and an n-side nitride semiconductor layer 11. The first electrodes 31 are disposed on and electrically connected to the n-side nitride semiconductor layer 11. The semiconductor layered body 1 is joined to the second substrate 22 via the second electrode 32, the insulation layer 35, and the metal layer 40. This makes it possible to supply power to the semiconductor layered body 1 via the second substrate 22 by using, for example, a conductive semiconductor substrate or metal substrate as the second substrate 22. The semiconductor layered body 1 having such a structure allows the active layer 12 to emit light when a voltage is applied between the first electrodes 31 and the second electrode 32. The light emitted by the semiconductor layered body 1 mainly exits the face of the n-side nitride semiconductor layer 11 on which the first electrodes 31 are disposed.

The light emitting element 10 according to this embodiment will be explained in detail below.

N-Side Nitride Semiconductor Layer

An n-side nitride semiconductor layer 11 includes a nitride semiconductor layer doped with an n-type impurity such as Si. The n-side nitride semiconductor layer 11 is formed with a plurality of layers. The n-side nitride semiconductor layer 11 may include, for example, an undoped semiconductor layer as a part. Here, an undoped semiconductor layer refers to a layer that is grown without adding any n-type impurity, and may contain, for example, the impurities that are unavoidably incorporated by being diffused from adjacent layers.

P-Side Nitride Semiconductor Layer

A p-side nitride semiconductor layer 13 has a nitride semiconductor layer doped with a p-type impurity such as Mg. The p-side nitride semiconductor layer 13 is formed with a plurality of layers. The p-side nitride semiconductor layer 13 may include, for example, an undoped semiconductor layer as a part. The p-side nitride semiconductor layer 13 has, for example, a p-type clad layer disposed in contact with an active layer 12 and a p-type contact layer disposed on the p-type clad layer. The p-type clad layer's band gap energy is larger than the band gap energy of a second barrier layer 2, for example. The p-type contact layer's band gap energy is smaller than the band gap energy of the second barrier layer 2, for example.

Active Layer

Figure 2:
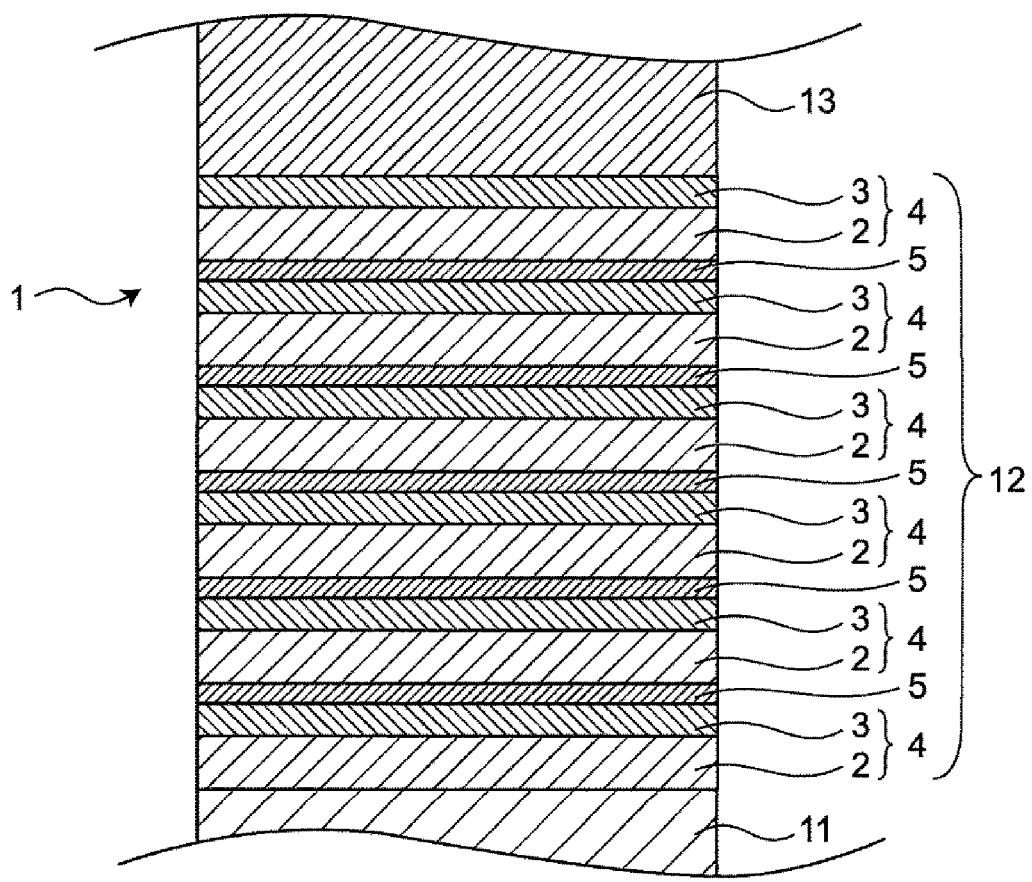
FIG. 2 is a diagram showing the structure of a semiconductor layered body of the light emitting element shown in FIG. 1.

An active layer 12 includes a plurality of well layers made of a nitride semiconductor and a plurality of barrier layers made of a nitride semiconductor. As shown in FIG. 2, the multiple quantum well structure according to this embodiment alternately includes, successively from the n-side nitride semiconductor layer 11, barrier layers 4, each including a first barrier layer 2 and a second barrier layer 3, and well layers 5.

First Barrier Layer

A first barrier layer 2 is stacked on the n-side semiconductor layer 11. The first barrier layer 2 is a nitride semiconductor layer containing Al and Ga. The nitride semiconductor layer containing Al and Ga is, for example, a ternary compound. The general formula for a first barrier layer 2 is, for example, $Al_aGa_{1-a}N$ ($0<a<1$). The Al content of a first barrier layer 1 is preferably $0.05 \le a \le 0.15$.

Figure 3:
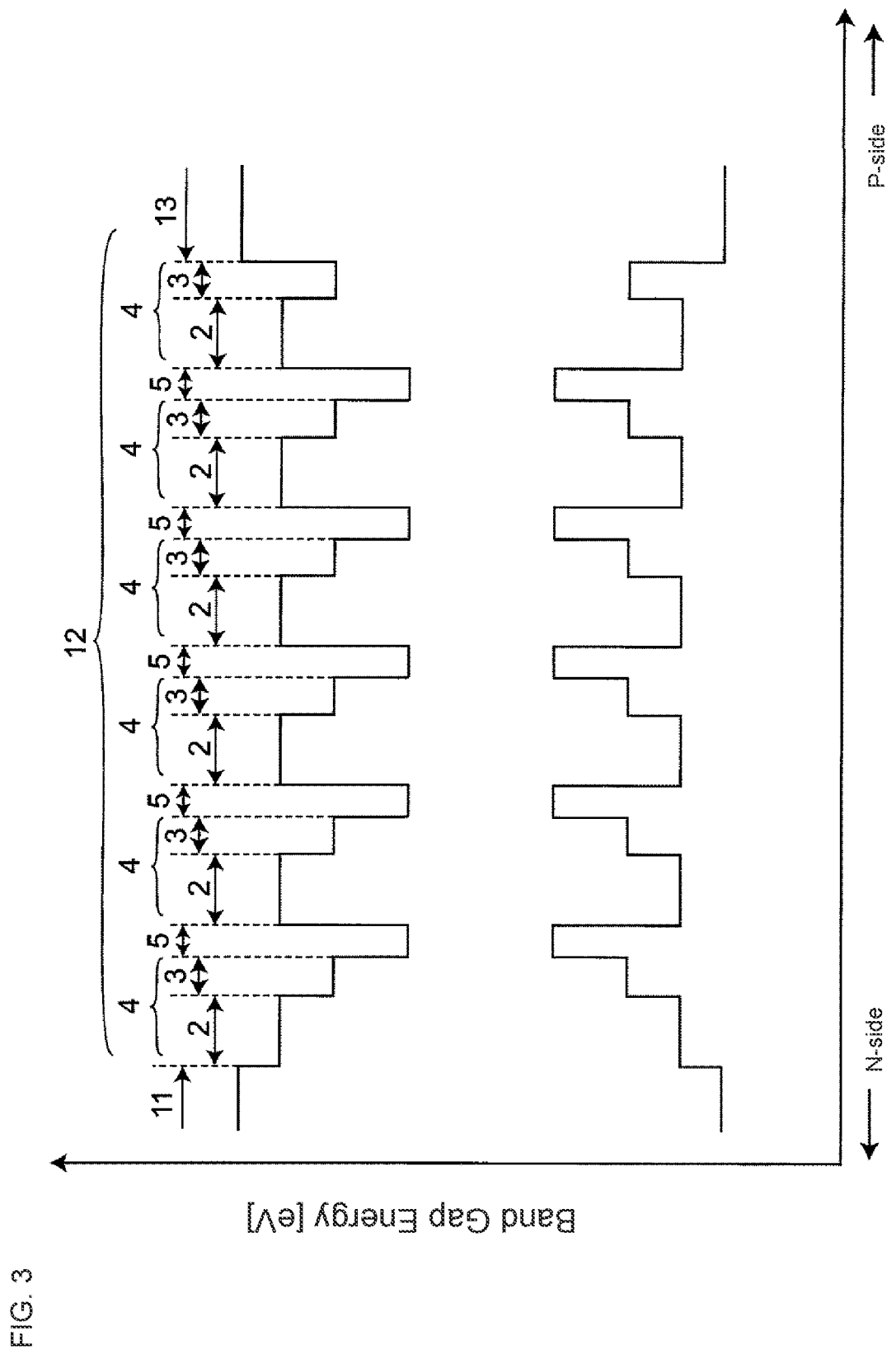
FIG. 3 is an energy band diagram of the semiconductor layered body structure shown in FIG. 2.

As shown in FIG. 3, a first barrier layer 2 has a larger band gap energy than the band gap energy of a second barrier layer 3. A first barrier layer 2 has a larger band gap energy than the band gap energy of a well layer 5.

The thickness of a first barrier layer 2 is preferably larger than the thickness of a second barrier layer 3. The thickness of a first barrier layer 2 is, for example, in a range of 10 nm to 35 nm.

Second Barrier Layer

A second barrier layer 3 is stacked on a first barrier layer 2. The second barrier layer 3 is a nitride semiconductor layer containing Al, Ga, and In. The nitride semiconductor layer containing Al, Ga, and In is, for example, a quaternary compound. The general formula for a second barrier layer 3 is, for example, $Al_bIn_cGa_{1-b-c}N$ ($0<b<1$, $0<c<1$, $b+c<1$). The Al content of a second barrier layer 3 is preferably $0.05 \le b \le 0.15$. The In content of a second barrier layer 3 is preferably $0.0001 \le c \le 0.01$.

As shown in FIG. 3, each second barrier layer 3 has a smaller band gap energy than the band gap energy of a first barrier layer 2, and a larger band gap energy than the band gap energy of a well layer 5. In other words, the semiconductor layered body 1 of the light emitting element 10 according to this embodiment has a band gap energy structure that satisfies the relationship: first barrier layer's band gap energy>second barrier layer's band gap energy>well layer's band gap energy. A second barrier layer 3 having a smaller band gap energy than the band gap energy of a first barrier layer 2 raises a concern of more easily absorbing light than a first barrier layer 2. Accordingly, the thickness of a second barrier layer 3 is preferably smaller than the thickness of a first barrier layer 2. The thickness of a second barrier layer 3 is, for example, in a range of 3 nm to 25 nm.

Well Layer

A well layer 5 is stacked on a second barrier layer 3. A well layer 5 is a nitride semiconductor layer and emits ultraviolet light. In the description herein, ultraviolet light means light having a wavelength of 400 nm at most. The nitride semiconductor layer is, for example, a ternary compound. The general formula for a well layer 5 is, for example, $In_eGa_{1-e}N$ ($0 \le e<1$). The In content is preferably $0 \le e \le 0.09$. A well layer 5 having such a composition emits ultraviolet light. The peak wavelength of the light emitted by a well layer 5 is, for example, in a range of 365 nm to 400 nm. Examples of the peak wavelength of a well layer 5 include 365 nm and 385 nm.

Furthermore, it is desirable for the In content of a well layer 5 to be identical to the In content of a second barrier layer 3. Forming the In content of a well layer 5 identical to the In content of a second barrier layer 3 can reduce the lattice constant difference between a well layer 5 and a second barrier layer 3, thereby moderating the lattice relaxation at the interface between the well layer 5 and the second barrier layer 3.

As shown in FIG. 3, each well layer 5 has a smaller band gap energy than the band gap energy of a first barrier layer 2. Each well layer 5 has a smaller band gap energy than the band gap energy of a second barrier layer 3.

The thickness of each well layer 5 is, for example, in a range of 5 nm to 30 nm. Some of the well layers 5 may have a different thickness from that of the other well layers 5.

As described above, stacking a well layer 5 on a second barrier layer 3 containing Al, Ga, and In can reduce the lattice relaxation at the interface between the second barrier layer 3 and the well layer 5, and can allow the well layer 5 to have good crystallinity when grown on the second barrier layer 3 having a small surface roughness value.

As such, the active layer 12 according to this embodiment includes, successively from the n-side nitride semiconductor layer side, a first barrier layer 2, a second barrier layer 3 having a smaller band gap energy than the band gap energy of the first barrier layer 2, and a well layer 5 having a smaller band gap energy than the band gap energy of the second barrier layer 3. This can improve the crystallinity of the well layer 5 and can enhance the effect of electron confinement in the well layer 5. This as a result can increase the electron-hole recombination probability, thereby increasing the emission output of the light emitting element 10.

Figure 4A:
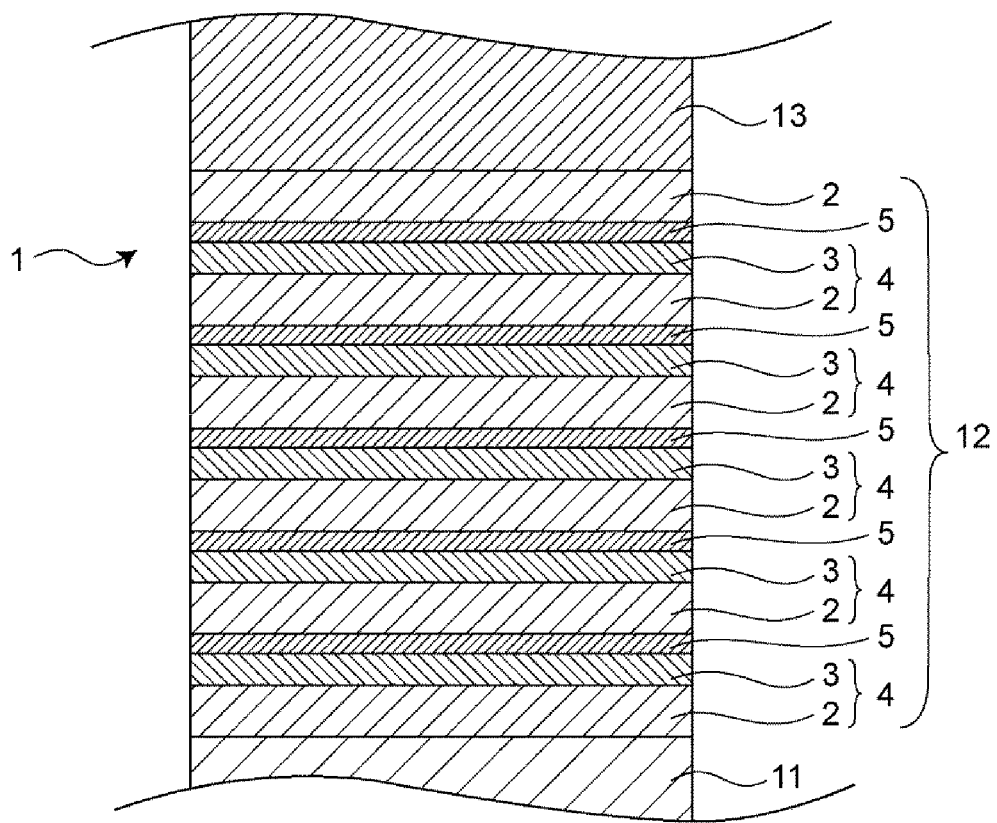
FIG. 4A is a diagram showing the structure of another semiconductor layered body of the light emitting element shown in FIG. 1.
Figure 4B:
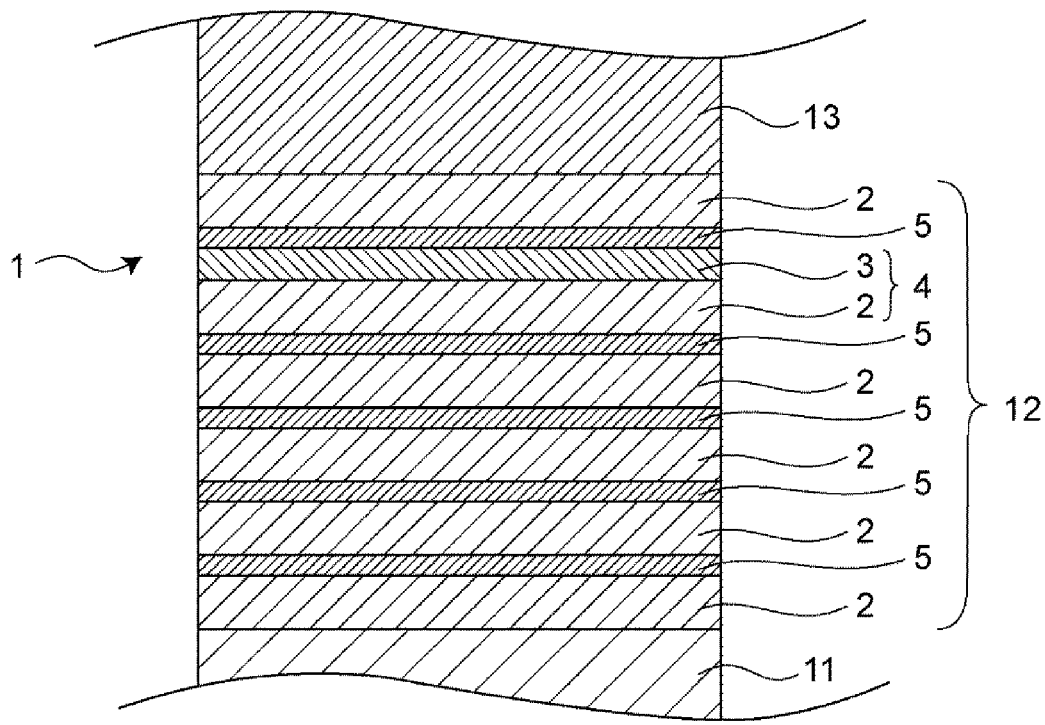
FIG. 4B is a diagram showing the structure of another semiconductor layered body of the light emitting element shown in FIG. 1.

In the active layer 12 according to this embodiment, as shown in FIG. 3, all barrier layers 4 are composed of two barrier layers, i.e., a first barrier layer 2 and a second barrier layer 3, but the barrier layers 4 are not limited to this configuration. For example, among the plurality of the barrier layers 4, some barrier layers 4 may be composed of two barrier layers, i.e., a first barrier layer 2 and a second barrier layer 3, while other barrier layers 4 are composed of one of the first or second barrier layers. For example, as shown in FIG. 4A, among the plurality of barrier layers 4, the one that is in contact with the p-side nitride semiconductor layer 13 may be composed only of a first barrier layer 2. This can further improve the recombination probability in the well layers 5. Alternatively, for example, as shown in FIG. 4B, among the plurality of barrier layers 4, the one that is in contact with the well layer 5 closest to the p-side nitride semiconductor layer 13 may be composed of a first barrier layer 2 and a second barrier layer 3, while the other barrier layers 4 are composed of only a first barrier layer 2. This can achieve the electron confining effect in the well layer 5 that is closest to the p-side nitride semiconductor layer 13 in which electron-hole recombination readily occurs, as well as reducing the absorption of light by the second barrier layers 2 as compared to the case in which all barrier layers 4 are composed of a first barrier layer 2 and a second barrier layer 3.

2. Method of Manufacturing Light Emitting Element

A method of manufacturing a light emitting element 10 according to this embodiment includes:
 (1) an n-side nitride semiconductor layer growing process in which an n-side nitride semiconductor layer is grown,
 (2) an active layer growing process in which an active layer emitted ultraviolet light, which includes a plurality of nitride semiconductor well layers and a plurality of nitride semiconductor barrier layers, is grown on the n-side nitride semiconductor layer,
 (3) a p-side nitride semiconductor layer growing process in which a p-side nitride semiconductor layer is grown on the active layer,
 (4) an electrode forming process in which first electrodes and second electrodes are formed, and
 (5) a cutting process.

Furthermore, the active layer growing process includes:
 (2-1) a first barrier layer growing process in which a first barrier layer is grown by using a source gas containing an Al source gas, a Ga source gas, and an N source gas,
 (2-2) a second barrier layer growing process in which a second barrier layer is grown on the first barrier layer by using a source gas containing an Al source gas, a Ga source gas, an In source gas, and an N source gas, and
 (2-3) a well layer growing process in which a well layer having a smaller band gap energy than the second barrier layer is grown on the second barrier layer by using a source gas containing a Ga source gas and an N source gas.

Figure 6:
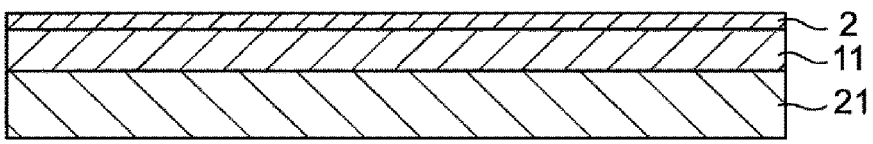
FIG. 6 is a cross-sectional view of the state after forming a first barrier layer on the n-side nitride semiconductor layer formed on the upper face of the first substrate in the method of manufacturing a light emitting element according to the embodiment of the present disclosure.
Figure 7:
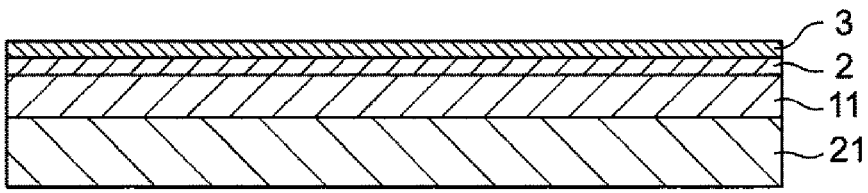
FIG. 7 is a cross-sectional view of the state after forming a second barrier layer on the n-side nitride semiconductor layer formed on the upper face of the first substrate in the method of manufacturing a light emitting element according to the embodiment of the present disclosure.
Figure 8:
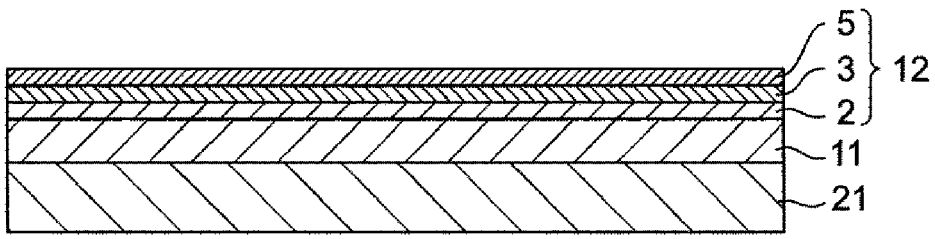
FIG. 8 is a cross-sectional view of the state after forming a well layer on the n-side nitride semiconductor layer formed on the upper face of the first substrate in the method of manufacturing a light emitting element according to the embodiment of the present disclosure.

A method of manufacturing a light emitting element according to this embodiment will be explained in detail below with reference to FIG. 5 to FIG. 14. In FIG. 5 to FIG. 14, the sizes of members might be exaggerated to make the drawings more easily understood. In FIG. 6-FIG. 8, in particular, the thicknesses of the barrier layers and the well layers are exaggerated.

(1) N-Side Nitride Semiconductor Layer Growing Process

Figure 5:
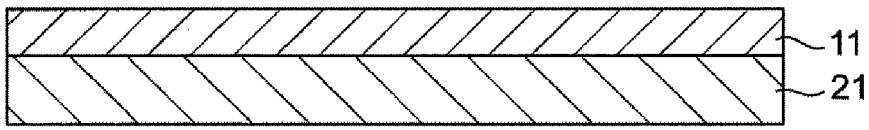
FIG. 5 is a cross-sectional view of the state after forming an n-side nitride semiconductor layer on the upper face of a first substrate in a method of manufacturing a light emitting element according to one embodiment of the present disclosure.

In an n-side nitride semiconductor layer growing process, as shown in FIG. 5, a first substrate 21 made of sapphire, for example, is prepared, and by growing an n-type contact layer and an n-type clad layer, for example, on the first substrate 21, an n-side nitride semiconductor layer 11 that includes, successively from the first substrate 21 side, an n-type contact layer and an n-type clad layer is formed. The n-side nitride semiconductor layer 11 may be formed on the first substrate 21 via a buffer layer.

(2) Active Layer Growing Process

Next, an active layer 12 is formed on the n-side nitride semiconductor layer 11. The active layer 12 includes a plurality of well layers made of a nitride semiconductor, and a plurality of barrier layers made of a nitride semiconductor. The active layer 12 is formed by the processes described below.

(2-1) First Barrier Layer Growing Process

First, as shown in FIG. 6, a first barrier layer 2 is grown on the n-side nitride semiconductor layer 11 by using a source gas containing an Al source gas, a Ga source gas, and an N source gas. In the case in which the composition of the first barrier layer 2 is AlGaN, for example, the first barrier layer 2 can be formed by setting the flow rates for the Al, Ga, and N source gases at 0.5 sccm to 2 sccm, 20 sccm to 50 sccm, and 4 slm to 10 slm, respectively.

It is desirable to allow a first barrier layer 2 to grow to a thickness in a range of 10 nm to 35 nm.

(2-2) Second Barrier Layer Growing Process

Then as shown in FIG. 7, a second barrier layer 3 is grown on the first barrier layer 2 by using a source gas containing an Al source gas, an In source gas, a Ga source gas, and an N source gas. In the case in which the composition of the second barrier layer 3 is AlInGaN, the second barrier 3 can be formed by setting the flow rates of the Al, In, Ga, and N source gases in ranges of 0.5 sccm to 2 sccm, 3 sccm to 15 sccm (desirably 5 sccm to 10 sccm), 20 sccm to 50 sccm, and 4 slm to 10 slm, respectively. As described above, the flow rates for the Al source gas, the Ga source gas, and the N source gas in the second barrier layer growing process can be set to be identical to the flow rates for the Al source gas, the Ga source gas, and the N source gas in the first barrier layer growing process. This makes it possible to form a second barrier layer 3 without suspending the flow of the Al source gas, the Ga source gas, or the N source gas used in the first barrier layer growing process or changing any of the flow rates for these source gases, while introducing the In source gas at a prescribed flow rate to be mixed into the three source gases. In other words, a first barrier layer 2 and a second barrier layer 3 can be formed in a continuous process.

It is desirable to grow a second barrier layer 3 to have a smaller thickness than the thickness of a first barrier layer 2. It is desirable to grow a second barrier layer 3 to a thickness in a range of 3 nm to 25 nm.

(2-3) Well Layer Growing Process

Next, as shown in FIG. 8, a well layer 5 is grown on the second barrier layer 3 by using a source gas containing a Ga source gas and a N source gas. In the case in which the composition of a well layer 5 is InGaN, a well layer 5 can be formed by setting the flow rates for the In, Ga, and N source gases in range of 6 sccm to 25 sccm, 20 sccm to 50 sccm, and 4 slm to 10 slm, respectively. In the well layer growing process, it is preferable to allow a well layer 5 to grow without introducing an Al source gas. In other words, the well layer 5 is preferably grown by setting the Al source gas flow rate at 0 sccm.

It is desirable to allow a well layer 5 to grow to a thickness in a range of 5 nm to 30 nm.

By repeating the first barrier layer growing process, the second barrier layer growing process, and the well layer growing process, an active layer 12 comprising a plurality of first barrier layers 2, a plurality of second barrier layers 3, and a plurality of well layers 5 can be formed. For example, the active layer growing process is completed with a second barrier growing process. In FIG. 8, in order to make the drawing easily understood, one first barrier layer 2, one second barrier layer 3, and one well layer 5 are collectively denoted as an active layer 12.

(3) P-Side Nitride Semiconductor Growing Process

Then by allowing a p-type clad layer and a p-type contact layer to grow on the active layer 12, for example, a p-side nitride semiconductor layer 13, which successively includes from the active layer 12 side a p-type clad layer and a p-type contact layer, is formed.

Figure 9:
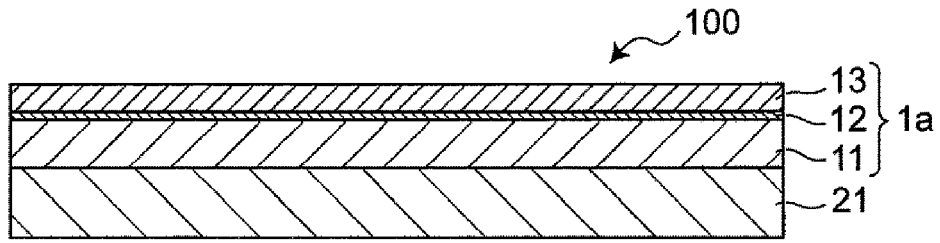
FIG. 9 is a cross-sectional view of a first wafer after forming a p-side nitride semiconductor layer on the active layer formed via the n-side nitride semiconductor layer on the upper face of the first substrate in the method of manufacturing a light emitting element according to the embodiment of the present disclosure.

By following these processes, a first wafer 100 in which a semiconductor layered structure 1a having an n-side nitride semiconductor layer 11, an active layer 12, and a p-side nitride semiconductor layer 13 are formed on a first substrate 21 is prepared as shown in FIG. 9.

(4) First and Second Electrode Forming Process

Figure 10:
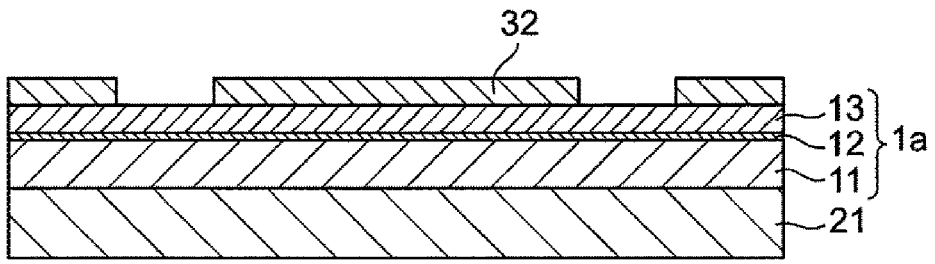
FIG. 10 is a cross-sectional view of the state after forming second electrodes each having a prescribed shape on the p-side nitride semiconductor layer of the first wafer in the method of manufacturing a light emitting element according to the embodiment of the present disclosure.
Figure 11:
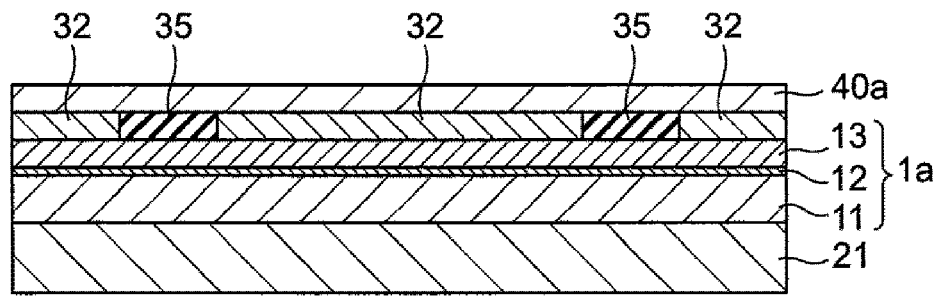
FIG. 11 is a cross-sectional view of the state after forming an insulation layer and a metal layer on the p-side nitride semiconductor layer of the first wafer with the second electrodes in the method of manufacturing a light emitting element according to the embodiment of the present disclosure.

Next, as shown in FIG. 10, on the p-side nitride semiconductor layer 13, second electrodes 32 are patterned and formed by using a known technique, such as a lift-off process. Then as shown in FIG. 11, an insulating layer 35 is formed in the areas on the p-side nitride semiconductor layer 13 where the second electrodes 32 are not formed, and a metal layer 40a is formed on the second electrodes 32 and the insulating layer 35. The insulating layer 35 can be formed, for example, by forming a resist on the second electrodes 32, forming an insulating layer 35 on the parts of the p-side nitride semiconductor layer 13 where the second electrodes 32 are not formed and on the resist, and removing the resist together with the insulating layer formed on the resist.

Figure 12:
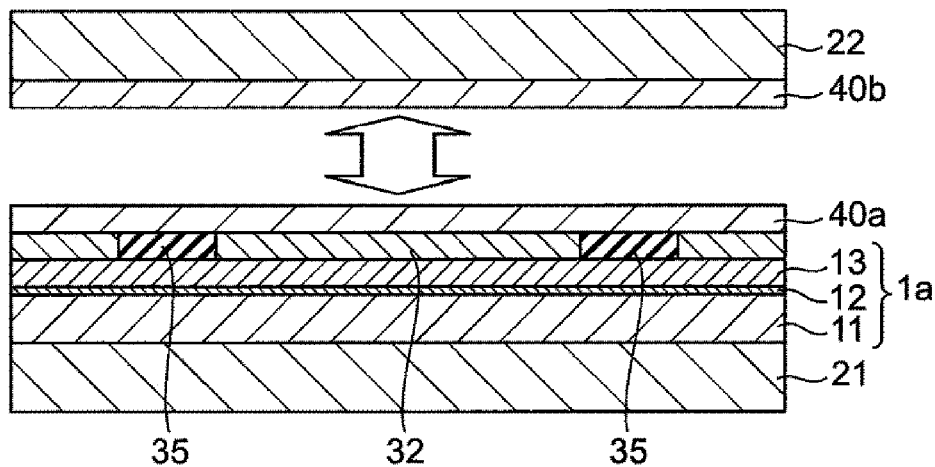
FIG. 12 is a cross-sectional view of the state in which a second substrate prepared by forming a metal layer on one of the faces is opposed to the first wafer in the method of manufacturing a light emitting element according to the embodiment of the present disclosure.

As shown in FIG. 12, a second substrate 22 on which a metal layer 40b is formed on one face is separately prepared, and the metal layer 40b of the second substrate 22 and the metal layer 40a of the fist substrate 21 are joined together. This joins the second substrate 22 onto the p-side nitride semiconductor layer 13 via the second electrodes 32, the insulating layer 35, and the metal layers 40a and 40b. After joining the second substrate 22, the first substrate 21 is removed, for example, by laser lift-off or wet etching.

Figure 13:
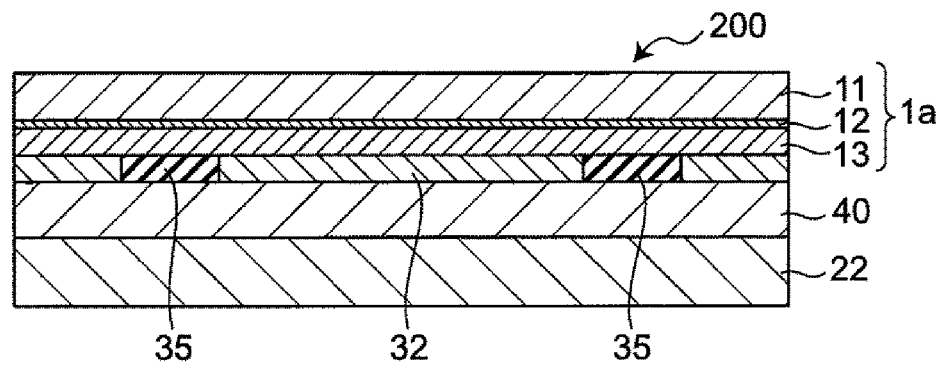
FIG. 13 is a cross-sectional view of a second wafer produced in the method of manufacturing a light emitting element according to the embodiment of the present disclosure.

In the manner described above, the semiconductor layered structure 1a formed on the first substrate 21 is transferred onto the second substrate 22 via the metal layer 40, the second electrodes 32, and the insulating layer 35. The metal layer 40 is a layer formed by joining the metal layer 40a and the metal layer 40b. In this manner, a second wafer 200 that includes semiconductor layered structure 1a on the second substrate 22 exposing the n-side nitride semiconductor layer 11 such as that shown in FIG. 13 is prepared. In other words, in the second wafer 200, on the second substrate 22, the p-side nitride semiconductor 13, the active layer 12, and the n-side nitride semiconductor layer 11 are successively stacked from the second substrate 22 side via the metal layer 40, the second electrodes 32, and the insulating layer 35.

Figure 14:
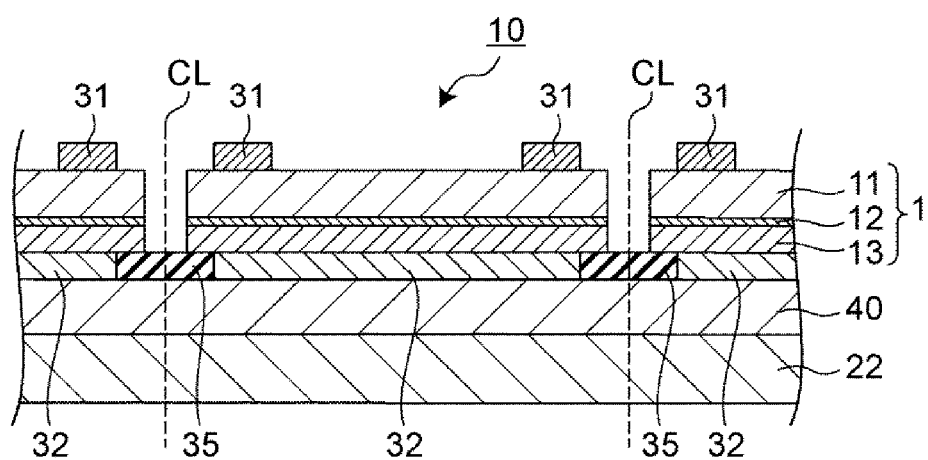
FIG. 14 is a cross-sectional view of the state after forming first electrodes by patterning on the n-side nitride semiconductor layer of the second wafer in the method of manufacturing a light emitting element according to the embodiment of the present disclosure.

Next, as shown in FIG. 14, the second wafer 200 is separated into a plurality of semiconductor stacks 1 by removing portions of the semiconductor layered structure 1a, for example, by dry etching such as reactive ion etching. First electrodes 31 are formed by patterning on the n-side nitride semiconductor layer 11 of the second wafer 200. The first electrodes 31 can be formed by a lift-off process using a resist or etching process in a similar manner to the method of forming the second electrodes 32 described above.

(5) Cutting Process

Finally, the second wafer 200 with the first electrodes 31 formed thereon is divided into individual light emitting elements 10 of a prescribed size. The second wafer can be divided by dicing along the prescribed cutting lines CL shown in FIG. 14.

Example 1

A light emitting element of Example 1 was produced as described below.

By preparing a first substrate 21 made of sapphire and growing thereon an n-type contact layer and an n-type clad layer, an n-side nitride semiconductor layer 11 that successively included an n-type contact layer and an n-type clad layer from the first substrate 21 side was formed.

Next, an $Al_{0.095}Ga_{0.905}N$ first barrier layer 2 was stacked on the n-side nitride semiconductor layer 11. The first barrier layer 2 was grown to a thickness of 29 nm. The flow rates for the Al, Ga, and N source gases for growing the first barrier layer 2 were set at 1.78 sccm, 43 sccm, and 7 slm, respectively.

Then an $In_{0.005}Ga_{0.995}N$ well layer 5 was stacked on the first barrier layer 2. The well layer 5 was grown to a thickness of 8 nm. The flow rates for the In, Ga, and N source gases for growing the well layer 5 were set at 15 sccm, 38 sccm, and 7 slm, respectively.

The formation of the stack structure having the first barrier layer 2 and the well layer 5 described above was repeated four times.

Next, an $Al_{0.095}Ga_{0.905}N$ first barrier layer 2 was stacked on the well layer 5. The first barrier layer 2 was grown to a thickness of 15 nm. The flow rates for the Al, Ga, and N source gases for growing the first barrier layer 2 were set at 1.78 sccm, 43 sccm, and 7 slm, respectively.

Next, an $Al_{0.095}In_{0.0005}Ga_{0.9050}N$ second barrier layer 3 was stacked on the first barrier layer 2. The second barrier layer 3 was grown to a thickness of 14 nm. The flow rates for the Al, In, Ga, and N source gases for growing the second barrier layer 3 were set at 1.78 sccm, 6 sccm, 43 sccm, and 7 slm, respectively. The second barrier layer 3 was grown by mixing into the Al, Ga, and N source gases used in growing the first barrier layer 2 an In source gas at the flow rate set as described above.

Then an $In_{0.005}Ga_{0.995}N$ well layer 5 was stacked on the second barrier layer 3. The well layer 5 was grown to a thickness of 15 nm. The flow rates for the In, Ga, and N source gases for growing the well layer 5 were set at 15 sccm, 38 sccm, and 7 slm, respectively.

Subsequently, by stacking an AlGaN barrier layer on the last well layer 5, an active layer 12 was formed.

After forming the active layer 12 grown in this manner, a p-side nitride semiconductor layer 13, which included a p-type clad layer and a p-type contact layer, was formed, whereby a first wafer 100 was prepared.

Next, on the p-side nitride semiconductor layer 13 of the first wafer 100, second electrodes 32 were formed by patterning, and the structure was transferred onto a second substrate 22 via a metal layer 40. Subsequently, the first substrate 21 was removed, first electrodes 31 were formed by patterning on the n-side nitride semiconductor layer 11, and the structure was cut into individual light emitting elements 10.

The emission output when supplying a 1000 mA current to the light emitting element of Example 1 produced as above was evaluated. Furthermore, the outputs were measured when driven at 25° C. and 85° C. temperatures to evaluate the output retention (output at 85° C./output at 25° C.). Furthermore, the full width at half maximum of the emission wavelength and the inverse voltage of the light emitting element were evaluated.

As a result, the emission output of the light emitting element of Example 1 was 1806.7 mW. The output retention was 85.3%, the full width at half maximum of the emission wavelength was 8.6 nm, and the inverse voltage was 9.0 V.

Reference Sample 1

A light emitting element of Reference Sample 1 was produced in a similar manner as the light emitting element of Example 1 except for making each barrier layer as a single AlGaN layer. The flow rates for the Al, Ga, and N source gases for growing the barrier layers were set at 1.78 sccm, 43 sccm, and 7 slm, respectively. Each barrier layer was grown to a thickness of 29 nm.

The emission output by supplying a 1000 mA current to the light emitting element of Reference Sample 1 produced as above was evaluated. In a similar manner to that in Example 1, the output retention, the full width at half maximum of the emission wavelength, and the inverse voltage were evaluated.

As a result, the emission output of the light emitting element of Reference Sample 1 was 1779.6 mW. The output retention was 84.7%, the full width at half maximum of the emission wavelength was 8.7 nm, and the inverse voltage was 8.5 V.

Table 1 shows the evaluation results of Example 1 and Reference Sample 1. In Table 1, in the case in which the barrier layers are each formed with a first barrier layer and a second barrier layer, the composition is indicated in the form of "first barrier layer/second barrier layer." An entry, "first barrier layer/second barrier layer," means that the first barrier layer and the second barrier layer are successively stacked from the n-side nitride semiconductor layer side.

TABLE 1

|  | Example 1 | Reference Sample 1 |
| --- | --- | --- |
| Emission Output [mW] | 1806.7 | 1779.6 |
| Retention [%] | 85.3 | 84.7 |
| Full Width at Half Maximum [nm] | 8.6 | 8.7 |
| Inverse Voltage [V] | 9.0 | 8.5 |
| Barrier Layer Composition | AlGaN/AlInGaN | AlGaN |

The results confirmed that the light emitting element of Example 1 having the barrier layers 4, which included the first barrier layers 2 and the second barrier layers 3 having a smaller band gap energy than the band gap energy of the first barrier layers 2, is of a higher emission output than the light emitting element of Reference Sample 1. Furthermore, it was confirmed that the light emitting element of Example 1 is superior to the light emitting element of Reference Sample 1 in terms of the output retention, the full width at half maximum, and the inverse voltage. It is presumed from the results that the light emitting element of Example 1 has a better well layer surface roughness condition than the light emitting element of Reference Sample 1 and reduced lattice relaxation at the interface between the barrier layers and the well layers.

Example 2

A light emitting element of Example 2 was produced as described below.

By preparing a first substrate made of sapphire and growing thereon an n-type contact layer and an n-type clad layer, an n-side nitride semiconductor layer 11 that successively included an n-type contact layer and an n-type clad layer from the first substrate 21 side was formed.

Next, an $Al_{0.095}Ga_{0.905}N$ first barrier layer 2 was stacked on the n-side nitride semiconductor layer 11. The first barrier layer 2 was grown to a thickness of 15 nm. The flow rates for the Al, Ga, and N source gases for growing the first barrier layer 2 were set at 1.53 sccm, 39 sccm, and 7 slm, respectively.

Then an $Al_{0.0945}In_{0.0005}Ga_{0.9050}N$ second barrier layer 3 was stacked on the first barrier layer 2. The second first barrier layer 3 was grown to a thickness of 14 nm. The flow rates for the Al, In, Ga, and N source gases for growing the second barrier layer 3 were set at 1.53 sccm, 6 sccm, 39 sccm, and 7 slm, respectively. The second barrier layer 3 was grown by mixing into the Al, Ga, and N source gases used in growing the first barrier layer 2 an In source gas at the flow rate set as described above.

Then an $In_{0.005}Ga_{0.995}N$ well layer 5 was stacked on the second barrier layer 3. The well layer 5 was grown to a thickness of 8 nm. The flow rates for the In, Ga, and N source gases for growing the well layer 5 were set at 15 sccm, 45 sccm, and 7 slm, respectively.

The formation of the stack structure having the first barrier layer 2, the second barrier 3, and the well layer 5 described above was repeated four times.

Next, an $Al_{0.095}Ga_{0.905}N$ first barrier layer 2 was stacked on the well layer 5. The first barrier layer 2 was grown to a thickness of 15 nm. The flow rates for the Al, Ga, and N source gases for growing the first barrier layer 2 were set at 1.53 sccm, 39 sccm, and 7 slm, respectively.

Next, an $Al_{0.095}In_{0.0005}Ga_{0.9050}N$ second barrier layer 3 was stacked on the first barrier layer 2. The second barrier layer 3 was grown to a thickness of 14 nm. The flow rates for the Al, In, Ga, and N source gases for growing the second barrier layer 3 were set at 1.53 sccm, 6 sccm, 39 sccm, and 7 slm, respectively. The second barrier layer 3 was grown by mixing into the Al, Ga, and N source gases used in growing the first barrier layer 2 an In source gas at the flow rate set as described above.

Then an $In_{0.0005}Ga_{0.995}N$ well layer 5 was stacked on the second barrier layer 3. The well layer 5 was grown to a thickness of 15 nm. The flow rates for the In, Ga, and N source gases for growing the well layer 5 were set at 15 sccm, 45 sccm, and 7 slm, respectively.

Subsequently, by stacking an AlGaN barrier layer on the last well layer 5, an active layer 12 was formed.

After forming the active layer 12 grown in this manner, a p-side nitride semiconductor layer 13 that included a p-type clad layer and a p-type contact layer was formed, whereby a first wafer 100 was prepared.

Next, second electrodes 32 were formed by patterning on the p-side nitride semiconductor layer 13 of the first wafer 100, first electrodes 31 were formed by patterning on the n-side nitride semiconductor layer 11, and the structure was cut into individual light emitting elements 10.

The emission output by supplying a 100 mA current to the light emitting element of Example 2 produced as above was evaluated. Furthermore, the full width at half maximum of the emission wavelength and the well layer surface roughness of the light emitting element were evaluated.

As a result, the emission output of the light emitting element of Example 2 was 48.7 mW. The full width at half maximum of the emission wavelength was 12.4 nm, and the surface roughness was 5.3 nm.

Reference Sample 2

A light emitting element of Reference Sample 2 was produced in a similar manner as the light emitting element of Example 2 except for making each barrier layer as a single $Al_{0.095}Ga_{0.905}N$ layer. The flow rates for the Al, Ga, and N source gases for growing the barrier layers were set at 1.53 sccm, 39 sccm, and 7 slm, respectively. The barrier layers were grown to a thickness of 29 nm.

The emission output when supplying a 100 mA current to the light emitting element of Reference Sample 2 produced as above was evaluated. In a similar manner to that of Example 2, the full width at half maximum of the emission wavelength and the well layer surface roughness of the light emitting element were evaluated.

As a result, the emission output of the light emitting element of Reference Sample 2 was 47.4 mW. The full width at half maximum of the emission wavelength was 12.6 nm, and the surface roughness was 6.0 nm.

Reference Sample 3

A light emitting element of Reference Sample 3 was produced in a similar manner to in the light emitting element of Example 2 except for making each barrier layer as a single $Al_{0.0945}In_{0.0005}Ga_{0.9050}N$ layer. The flow rates for the Al, In, Ga, and N source gases for growing the barrier layers were set at 1.53 sccm, 6 sccm, 39 sccm, and 7 slm, respectively. Each barrier layer was grown to a thickness of 29 nm.

The emission output when supplying a 100 mA current to the light emitting element of Reference Sample 3 produced as above was evaluated. In a similar manner to that in Example 2, the full width at half maximum of the emission wavelength and the well layer surface roughness of the light emitting element were evaluated.

As a result, the emission output of the light emitting element of Reference Sample 3 was 48 mW. The full width at half maximum of the emission wavelength was 12.3 nm, and the surface roughness was 4.7 nm.

Reference Sample 4

A light emitting element of Reference Sample 4 was produced in a similar manner as the light emitting element of Example 1 except for making each first barrier layer an $Al_{0.0945}In_{0.0005}Ga_{0.9050}N$ layer and each second barrier layer an $Al_{0.095}Ga_{0.905}N$ layer. In other words, in the light emitting element of Reference Sample 4, the composition of each first barrier layer was identical to the composition of a second barrier layer of Example 2, and the composition of each second barrier layer was identical to the composition of a first barrier layer of Example 2. In the light emitting element of Reference Sample 4, the band gap energy of each second barrier layer is larger than the band gap energy of each first barrier layer. Accordingly, the band gap energy structure of the semiconductor stack in the light emitting element of Reference Sample 4 satisfies the relationship: second barrier layer's band gap energy>first barrier layer's band gap energy>well layer's band gap energy.

The flow rates for the Al, In, Ga, and N source gases for growing the first barrier layers were set at 1.53 sccm, 6 sccm, 39 sccm, and 7 slm, respectively. Each first barrier layer was grown to a thickness of 15 nm. The flow rates for the Al, Ga, and N source gases for growing the second barrier layers were set at 1.53 sccm, 39 sccm, and 7 slm, respectively. Each second barrier layer was grown to a thickness of 14 nm.

The emission output when supplying a 100 mA current to the light emitting element of Reference Sample 4 produced as above was evaluated. In a similar manner to that of Example 2, the full width at half maximum of the emission wavelength and the well layer surface roughness of the light emitting element were evaluated.

As a result, the emission output of the light emitting element of Reference Sample 4 was 47.3 mW. The full width at half maximum of the emission wavelength was 12.5 nm, and the surface roughness was 6.6 nm.

Table 2 shows the evaluation results of Example 2, and Reference Samples 2 to 4. In Table 2, in the case in which the barrier layers are formed with a first barrier layer and a second barrier layer, the composition is indicated in the form of "first barrier layer/second barrier layer." An entry, "first barrier layer/second barrier layer," means that the first barrier layer and the second barrier layer are successively stacked from the n-side nitride semiconductor layer side.

TABLE 2

|  | Example 2 | Reference Sample 2 | Reference Sample 3 | Reference Sample 4 |
|---|---|---|---|---|
| Emission Output [mW] | 48.7 | 47.4 | 48 | 47.3 |
| Full Width at Half Maximum [nm] | 12.4 | 12.6 | 12.3 | 12.5 |
| Surface Roughness [nm] | 5.3 | 6.0 | 4.7 | 6.6 |
| Barrier Layer Composition | AlGaN/AlInGaN | AlGaN | AlInGaN | AlInGaN/AlGaN |

The results confirmed that the light emitting element of Example 2, which included the barrier layers 4 each having a first barrier layer 2 and a second barrier layers 3 with a smaller band gap energy than the first barrier layer 2, is of a higher emission output than the light emitting elements of Reference Samples 2 to 4.

It was confirmed based on the comparison of Example 2 and Reference Sample 4 that the light emitting element of Example 2 having the band gap energy relationship in which the first barrier layer>the second barrier layer is of a higher emission output than the light emitting element of Reference Sample 4 having the band gap energy relationship in which the second barrier layer>the first barrier layer. This is presumably because Example 2 has a higher effect of electron confinement than Reference Sample 4. Furthermore, it was confirmed that the full width at half maximum of the emission wavelength of the light emitting element of Example 2 was about the same as those of Reference Samples 2 to 4, and the well layer surface roughness of Example 2 was a better value than those of Reference Samples 2 to 4. Based on these, the barrier layers and the well layers of the light emitting element of Example 2 presumably have better crystallinity than the light emitting elements of Reference Samples 2 and 4. The surface roughness in the light emitting element of Example 2 was not as good as Reference Sample 3 whose barrier layer composition was AlInGaN, but the emission output of the light emitting element of Example 2 was confirmed to be higher than Reference Sample 3. It is presumed from this that the light emitting element of Example 2 has good crystallinity in the barrier layers and the well layers, and is highly effective in confining electrons.

Certain embodiments and examples of the present invention have been explained above, but details of the elements disclosed in the description can vary, i.e., a combination or the order of certain elements described in the embodiments and examples can be modified without deviating from the scope of claims or the ideas of the present invention.

What is claimed is:
1. A method of manufacturing a light emitting element, the method comprising:
  an n-side nitride semiconductor layer growing process in which an n-side nitride semiconductor layer is grown;
  an active layer growing process in which an active layer comprising a plurality of nitride semiconductor well layers and a plurality of nitride semiconductor barrier layers is grown on the n-side nitride semiconductor layer, wherein the active layer is configured to emit ultraviolet light; and a p-side nitride semiconductor layer growing process in which a p-side nitride semiconductor layer is grown on the active layer, wherein:

the active layer growing process comprises:

a first barrier layer growing process in which a first barrier layer is grown by using a source gas comprising an Al source gas, a Ga source gas, and an N source gas, wherein, in the first barrier layer growing process, a flow rate for the Al source gas is in a range of 0.5 sccm to 2 sccm, a flow rate for the Ga source gas is in a range of 20 sccm to 50 sccm, and a flow rate for the N source gas is in a range of 4 slm to 10 slm, a second barrier layer growing process in which a second barrier layer is grown on the first barrier layer by using a source gas comprising an Al source gas, a Ga source gas, an In source gas, and an N source gas, wherein, in the second barrier layer growing process, a flow rate for the Al source gas is in a range of 0.5 sccm to 2 sccm, a flow rate for the Ga source gas is in a range of 20 sccm to 50 sccm, a flow rate for the N source gas is in a range of 4 slm to 10 slm, and a flow rate for the In source gas is in a range of 3 sccm to 15 sccm, and a well layer growing process in which a well layer having a smaller band gap energy than the second barrier layer is grown on the second barrier layer by using a source gas comprising a Ga source gas and an N source gas.

2. The method of manufacturing a light emitting element according to claim 1, wherein:
in the second barrier layer growing process, the flow rate for the In source gas is in a range of 5 sccm to 10 sccm.

3. The method of manufacturing a light emitting element according to claim 1, wherein:
in the well layer growing process, the flow rate for the Ga source gas is in a range of 20 sccm to 50 sccm, the flow rate for the N source gas is in a range of 4 slm to 10 slm, and the flow rate for the In source gas is in a range of 6 sccm to 25 sccm.

4. The method of manufacturing a light emitting element according to claim 2, wherein:
in the well layer growing process, the flow rate for the Ga source gas is in a range of 20 sccm to 50 sccm, the flow rate for the N source gas is in a range of 4 slm to 10 slm, and the flow rate for the In source gas is in a range of 6 sccm to 25 sccm.

5. The method of manufacturing a light emitting element according to claim 3, wherein:
in the well layer growing process, the well layer is grown without introducing the Al source gas.

6. The method of manufacturing a light emitting element according to claim 4, wherein:
in the well layer growing process, the well layer is grown without introducing the Al source gas.

7. The method of manufacturing a light emitting element according to claim 1, wherein:
in the second barrier layer growing process, the second barrier layer is grown to a smaller thickness than a thickness of the first barrier layer.

8. The method of manufacturing a light emitting element according to claim 1, wherein:
in the first barrier layer growing process, the first barrier layer is grown to a thickness in a range of 10 nm to 35 nm.

9. The method of manufacturing a light emitting element according to claim 1, wherein:
in the second barrier layer growing process, the second barrier layer is grown to a thickness in a range of from 3 nm to 25 nm.

10. A method of manufacturing a light emitting element, the method comprising:
an n-side nitride semiconductor layer growing process in which an n-side nitride semiconductor layer is grown;
an active layer growing process in which an active layer comprising a plurality of nitride semiconductor well layers and a plurality of nitride semiconductor barrier layers is grown on the n-side nitride semiconductor layer, wherein the active layer is configured to emit ultraviolet light; and
a p-side nitride semiconductor layer growing process in which a p-side nitride semiconductor layer is grown on the active layer, wherein:
the active layer growing process comprises:
a first barrier layer growing process in which a first barrier layer is grown by using a source gas comprising an Al source gas, a Ga source gas, and an N source gas,
a second barrier layer growing process in which a second barrier layer is grown on the first barrier layer by using a source gas comprising an Al source gas, a Ga source gas, an In source gas, and an N source gas, and
a well layer growing process in which a well layer having a smaller band gap energy than the second barrier layer is grown on the second barrier layer by using a source gas comprising a Ga source gas and an N source gas, wherein:
flow rates for the Al source gas, the Ga source gas, and the N source gas in the second barrier layer growing process are identical to flow rates for the Al source gas, the Ga source gas, and the N source gas in the first barrier layer growing process.

11. The method of manufacturing a light emitting element according to claim 10, wherein:
in the second barrier layer growing process, the second barrier layer is grown to a smaller thickness than a thickness of the first barrier layer.

12. The method of manufacturing a light emitting element according to claim 10, wherein:
in the first barrier layer growing process, the first barrier layer is grown to a thickness in a range of 10 nm to 35 nm.

13. The method of manufacturing a light emitting element according to claim 10, wherein:
in the first barrier layer growing process, the flow rate for the Al source gas is in a range of 0.5 sccm to 2 sccm, the flow rate for the Ga source gas is in a range of 20 sccm to 50 sccm, and the flow rate for the N source gas is in a range of 4 slm to 10 slm, and
in the second barrier layer growing process, the flow rate for the Al source gas is in a range of 0.5 sccm to 2 sccm, the flow rate for the Ga source gas is in a range of 20 sccm to 50 sccm, the flow rate for the N source gas is in a range of 4 slm to 10 slm, and the flow rate for the In source gas is in a range of 3 sccm to 15 sccm.

14. The method of manufacturing a light emitting element according to claim 13, wherein:

in the second barrier layer growing process, the flow rate for the In source gas is in a range of 5 sccm to 10 sccm.

15. The method of manufacturing a light emitting element according to claim 13, wherein:
in the well layer growing process, the flow rate for the Ga source gas is in a range of 20 sccm to 50 sccm, the flow rate for the N source gas is in a range of 4 slm to 10 slm, and the flow rate for the In source gas is in a range of 6 sccm to 25 sccm.

16. The method of manufacturing a light emitting element according to claim 15, wherein:
in the well layer growing process, the well layer is grown without introducing the Al source gas.

17. The method of manufacturing a light emitting element according to claim 10, wherein:
in the second barrier layer growing process, the second barrier layer is grown to a thickness in a range of from 3 nm to 25 nm.

\* \* \* \* \*